US008324505B2

(12) United States Patent
Kyhl

(10) Patent No.: US 8,324,505 B2
(45) Date of Patent: Dec. 4, 2012

(54) TEMPERATURE TOLERANT COVER LAYER CONSTRUCTION

(75) Inventor: Cary C. Kyhl, Grapevine, TX (US)

(73) Assignee: Raytheon Company, Waltham, MA (US)

(*) Notice: Subject to any disclaimer, the term of this patent is extended or adjusted under 35 U.S.C. 154(b) by 269 days.

(21) Appl. No.: 12/781,642

(22) Filed: May 17, 2010

(65) Prior Publication Data
US 2011/0278046 A1 Nov. 17, 2011

(51) Int. Cl.
*H05K 1/00* (2006.01)
(52) U.S. Cl. ...... 174/254; 174/250; 174/68.1; 174/75 F; 361/398
(58) Field of Classification Search ............ 174/254, 174/250, 75 F, 68.1; 361/749, 398
See application file for complete search history.

(56) References Cited

U.S. PATENT DOCUMENTS 5,808,996 A * 9/1998 Aoyama .......... 720/651
6,224,395 B1 5/2001 Dahlen et al.

FOREIGN PATENT DOCUMENTS
JP 3 043912 A 2/1991

OTHER PUBLICATIONS

Extended European search report for corresponding European Application No. 11158484.3, extended European search report dated Sep. 19, 2011 and mailed Sep. 28, 2011 (4 pgs.).

* cited by examiner

*Primary Examiner* — Yuriy Semenenko
*Assistant Examiner* — Andargie M Aychillhum
(74) *Attorney, Agent, or Firm* — Christie, Parker & Hale, LLP

(57) ABSTRACT

The present invention relates to flex cables, and more particularly to a temperature tolerant cover layer construction for a flex cable. In one embodiment, a flex cable designed to be bent to a particular curved shape includes one or more slits formed in the inner cover layer, to reduce the amount of material in the cover layer on the inside radius of the curve. By reducing the amount of cover layer material on the inside of the curve, the slits reduce the compressive stress in the cover layer. The slits are formed prior to laminating the flex cable so that upon lamination the flexible filler material below the cover layer fills the slits, providing a compliant, protective layer that bends into the desired curve and protects the active components inside the cable. The slits reduce the compressive stress along the inside cover layer and thereby prevent the cover layer from separating from the rest of the cable when the flex cable is subjected to high temperature conditions.

15 Claims, 6 Drawing Sheets

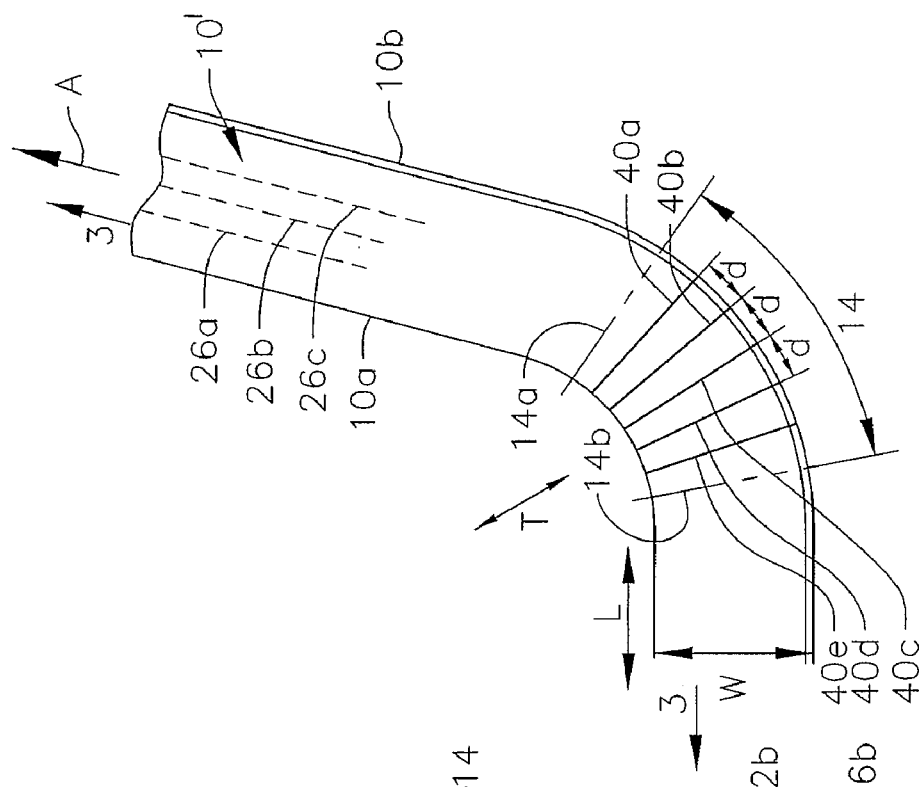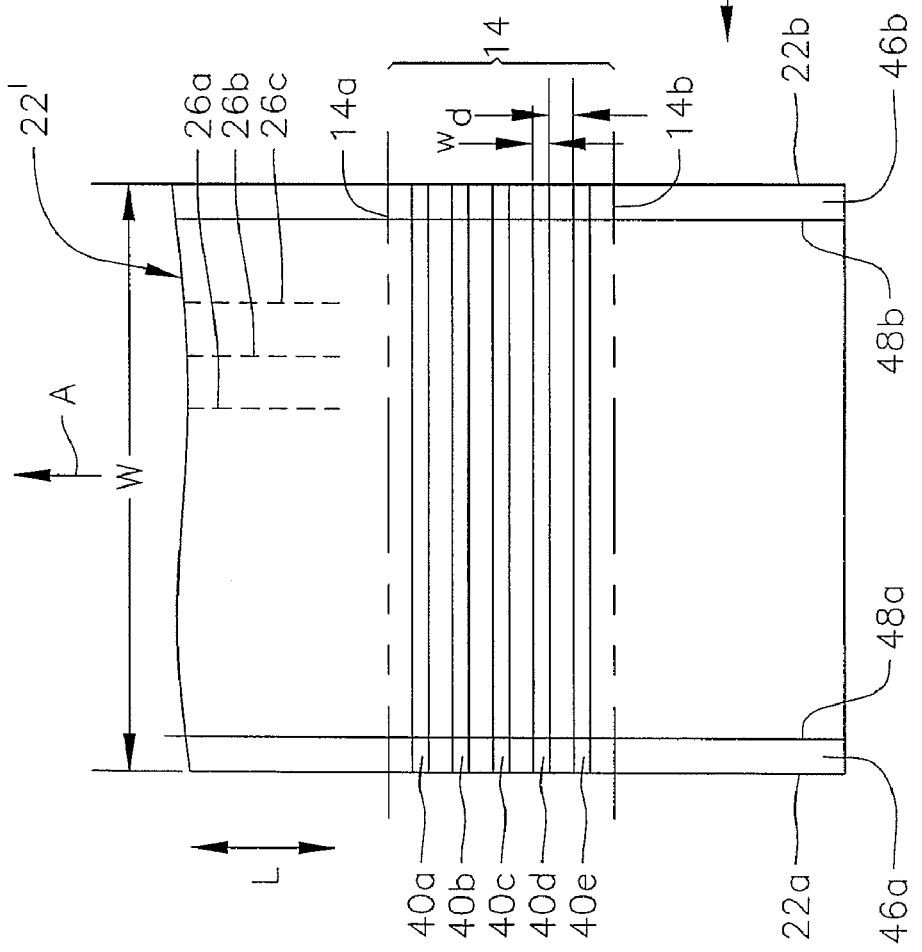

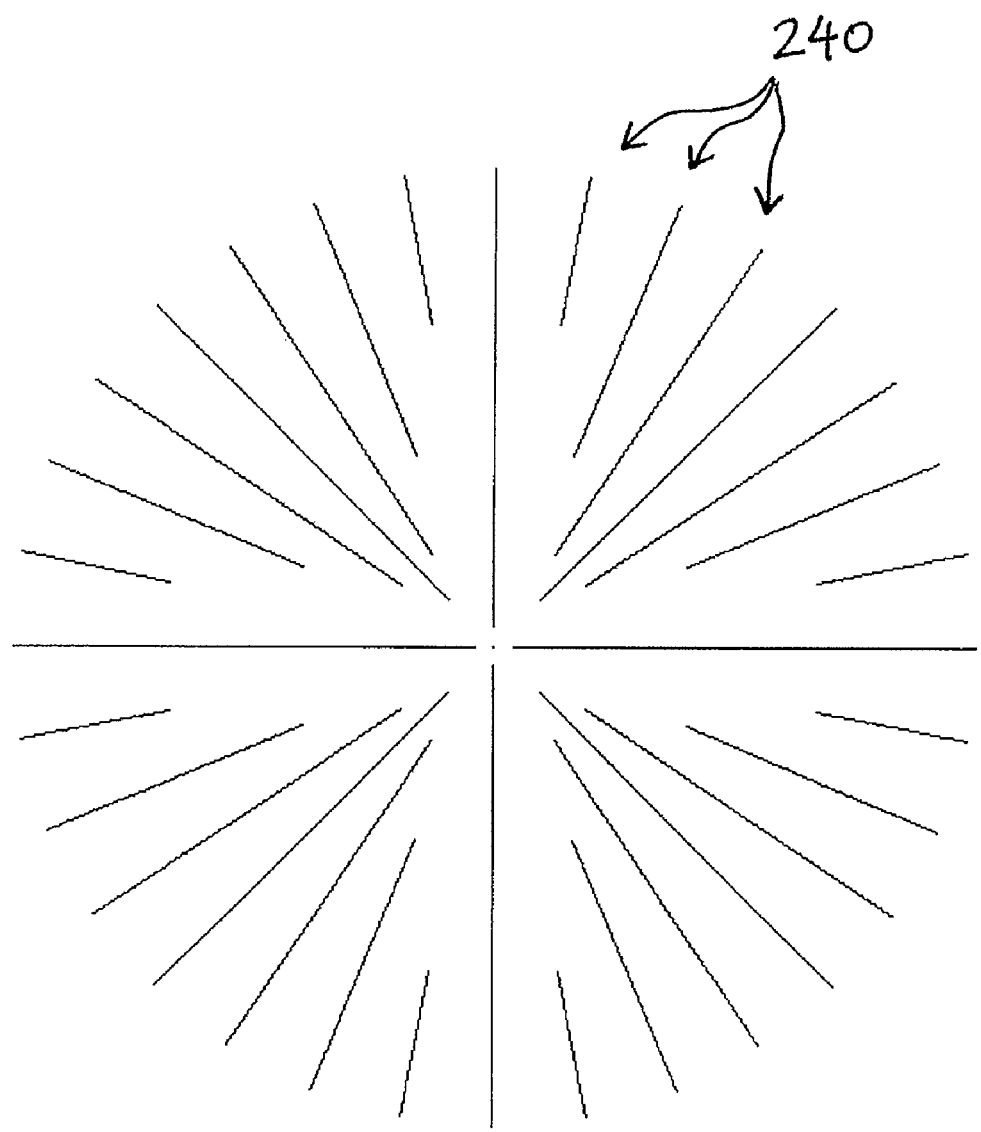

TEMPERATURE TOLERANT COVER LAYER CONSTRUCTION

FIELD OF THE INVENTION

The present invention relates to flexible printed wiring cables, and more particularly to a temperature tolerant cover layer construction for such a cable.

BACKGROUND

Electrical components in many different applications utilize flexible printed wiring cables, or "flex" cables, such as cables for electrical power, digital signals, and radio frequency signals. For example, electronic packaging of complex hardware utilizes flex cables to connect various components within the volume allowed. These cables may be bent once during manufacturing in order to fit into a required space and then remain in that bent shape during operation, such as cable components used in commercial electronics, aircraft systems, automotive applications, engine compartments, power plants, sensor equipment, and many other applications. In other applications flex cables connect components through a hinge or other moving part that subjects the cables to repeated bending during operation, such as flex cables in laptop computers, cell phones, and automobile doors. The term "ribbon cable" may also be used in some cases to refer to these printed circuit flex cables.

Flex cables are subject to two types of high-temperature conditions. The first is high temperatures during operation. For example, a flex cable may connect to a sensor that is placed in a high temperature compartment or in close proximity to a very high temperature component. The second is high temperatures experienced during a manufacturing process. For example, a flex cable may undergo a high-temperature soldering process to attach sensitive electrical components to make the flex cable assembly.

Preventive measures typically must be taken to prevent these high temperature conditions from causing the cable to buckle and delaminate, with the cover portion of the cable separating from the rest of the cable and creating an opening or void. This delamination exposes the conductor or other components inside the cable to environmental hazards that can cause permanent failure. Therefore, flex cables are often limited to applications in which the manufacturing and/or operating temperature remains under a maximum temperature, to prevent the cable from delaminating. The radius of curvature of the flex cable may also be kept above a minimum radius, limiting the flex cable to large-radius curves in order to reduce the amount of compressive stress in the cable and prevent buckling at high temperature conditions.

Accordingly, there is still a need for a flex cable that tolerates high temperature manufacturing and/or operating conditions without delaminating.

SUMMARY

The present invention relates to flex cables, and more particularly to a temperature tolerant cover layer construction for a flex cable. In one embodiment, a flex cable designed to be bent to a particular curved shape includes one or more slits formed in the inner cover layer, to reduce the amount of material in the cover layer on the inside radius of the curve. By reducing the amount of cover layer material on the inside of the curve, the slits reduce the compressive stress in the cover layer. The slits are formed prior to the process of laminating the flex cable so that upon lamination the flexible filler material below the cover layer fills the slits, providing a compliant, protective layer that bends into the desired curve and protects the active components inside the cable. The slits reduce the compressive stress along the inside cover layer and thereby prevent the cover layer from separating from the rest of the cable when the flex cable is subjected to high temperature conditions.

In one embodiment, a flex cable for bending into a curve includes a core layer comprising a conductor extending in an axial direction, an outer layer covering the core layer along an outside radius of the curve, and an inner layer covering the core layer along an inside radius of the curve. The cable also includes at least one slit formed in the inner layer. The at least one slit extends in a direction that is transverse to the axial direction of the conductor.

In one embodiment, a method of constructing a temperature-tolerant flex cable includes providing an inner layer, an outer layer, and a core layer, and forming a plurality of slits in the inner layer. The method also includes applying heat and pressure to the inner layer, the outer layer, and the core layer to adhere them together into a cable. The method also includes bending the cable into a bend feature, with the inner layer on an inside radius of the bend feature, and exposing the bend feature to a high-temperature condition.

BRIEF DESCRIPTION OF THE DRAWINGS

FIG. 4 is a top view of a cover sheet according to an embodiment of the invention.

FIG. 5 is a partial perspective view of a flex cable according to an embodiment of the invention.

FIG. 7 is a schematic view of an arrangement of slits for a flex cable according to an embodiment of the invention.

DETAILED DESCRIPTION

The present invention relates to flex cables, and more particularly to a temperature tolerant cover layer construction for a flex cable. In one embodiment, a flex cable designed to be bent to a particular curved shape includes one or more slits formed in the inner cover layer, to reduce the amount of material in the cover layer on the inside radius of the curve. By reducing the amount of cover layer material on the inside of the curve, the slits reduce the compressive stress in the cover layer. The slits are formed prior to the process of laminating the flex cable so that upon lamination the flexible filler material below the cover layer fills the slits, providing a compliant, protective layer that bends into the desired curve and protects the active components inside the cable. The slits are sized and spaced according to the dimensions of the cable and the curve. The slits reduce the compressive stress along the inside cover layer and thereby prevent the cover layer from separating from the rest of the cable when the flex cable is subjected to high temperature conditions during manufacturing or during operation. As used herein, "high temperature" means a prolonged exposure (more than a few seconds) at a temperature above 125° C.

Figure 1:
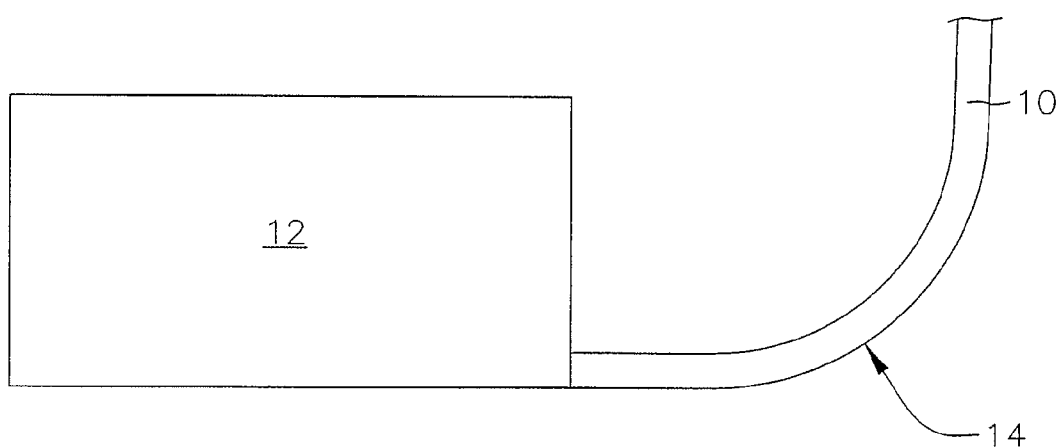
FIG. 1 is a schematic view of a flex cable attached to an electrical component.

An example of a flex cable 10 is shown in FIG. 1. The flex cable 10 is attached to an electrical component 12, such as an interface feature (such as a connector), a printed circuit board, a sensor in an engine compartment, an electronic device, or many other applications. The flex cable 10 includes a curved portion 14 for fitting the component 12 and cable 10 into a constrained space and/or for repeated bending during operation. The curved portion 14 is shown as a simple bend, but it could be a three-dimensional surface with any curved geometry. Additionally, the cable can bend in both directions, so that the inner side of the curve at one portion becomes the outer side at another bend portion.

Figure 2:
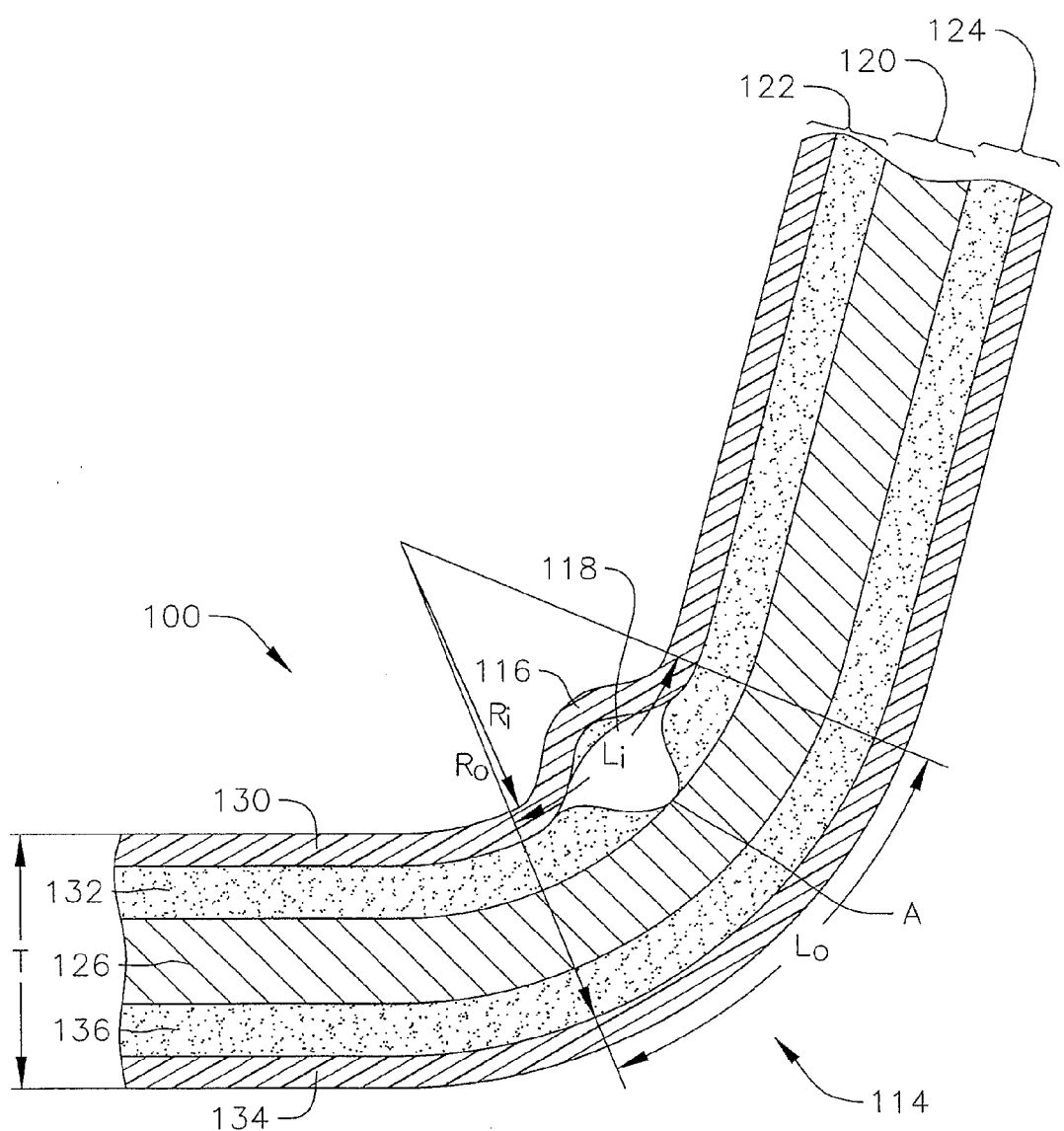
FIG. 2 is a partial cross-sectional view of a buckled flex cable according to the prior art.

Bending the cable into a curved shape introduces stresses into the various layers of the cable. An example of a prior art cable 100 subject to these stresses is shown in FIG. 2. The cable 100 includes a core layer 120, an inner layer 122, and an outer layer 124. The core layer 120 includes an active element such as a conductor 126. The inner layer 122 includes a cover layer 130 and a filler layer 132, and the outer layer includes a cover layer 134 and a filler layer 136. These layers 130, 132, 134, 136 protect the conductor element 126 from environmental exposure.

The cable 100 includes a curved section 114. The curved section 114 bends the cable into a curve with an inner radius Ri at the inner cover layer 130 and an outer radius Ro at the outer cover layer 134. Due to the thickness T of the cable 100, the inner radius Ri is shorter than the outer radius Ro. As a result, the length of the curve Li along the inner cover layer 130 is shorter than the length of the curve Lo along the outer cover layer 134. Along the curved portion 114, the inner cover layer 130 is subjected to compressive stresses, and the outer cover layer 134 is subjected to tensile stresses.

In some prior art cables such as the cable 100, a filler layer 132, 136 is included between each cover layer 130, 134 and the conductor 126. This filler layer 132, 136 is an adhesive material that encases the conductor 126 and adheres to the cover 130, 134 and spaces and electrically and environmentally isolates the conductor 126. However, this type of filler material typically has a low glass transition temperature $T_{g\text{-}filler}$ (for example, approximately 40° C.), and its material properties degrade at high temperatures (above 125° C.). At these temperatures the material becomes soft and weakens, and the soft layer separates from the cover layer 130. The material of the cover layer 130, 134 has a higher glass transition temperature $T_{g\text{-}cover}$ (for example, approximately 360° C.), and thus it does not exhibit the same degradation in strength as the filler material, at temperature between the two glass transition temperatures.

At temperatures above the glass transition temperature of the filler layer, the filler material softens and separates from the cover layer and/or the conductor, as shown in FIG. 2. The cover layer 130 is then free to expand outwardly to relieve the compressive stresses in that layer, and a bulge or buckle 116 forms in the inner cover layer 130 at the curve 114. This buckle 116 creates a void 118 between the cover layer 130 and the adhesive filler 132 and/or between the filler 132 and the conductor 126. The filler 132 may separate, with a portion of it remaining attached to the conductor 126 and a portion remaining attached to the cover layer 130. The separation of the filler layer 132 may expose the conductor 126, as shown at point A in FIG. 2. Additionally, the buckle 116 may be exposed at its longitudinal ends, thereby opening the void 118 to the external environment. This void 118 collects contaminants in its operating environment such as moisture, which can further degrade the layers of the cable and lead to corrosion, short circuits, and mechanical failure of the conductor 126.

As a result, the cable 100, when formed or bent or otherwise put into a curved or three-dimensional shape, is limited to operating and manufacturing conditions below a certain maximum temperature, to prevent buckles and voids from forming in the cover layer. This temperature maximum limits the number of applications where the cable 100 can be utilized, eliminating some applications with high-temperature operating conditions, such as certain sensors that operate at very high temperatures.

This temperature maximum also limits the manufacturing process for the electrical component that includes the cable 100. In some situations, a high-temperature soldering process is used to mount sensitive electronic components to a circuit board or other component. When the bent flex cable 100 is temperature-limited, this soldering process must be performed before the cable 100 is bent into its curved shape, while the cable is in an as-laminated minimal internal stress condition. If the cable is bent before soldering, heat from the soldering process can cause the cable 100 to delaminate at the curve 114, as shown in FIG. 2. If the cable is bent after soldering, the curved portion 114 is not subjected to this high temperature. However, when the cable is bent after soldering, the bending procedure for forming the curve 114 can stress the soldered joints and even cause them to fracture and break. Solder joints are often formed in close proximity to bend features, and therefore the bending step can stress the solder joint. Even if the joint does not break, the bending process can create stresses in the solder joint that weaken the structure and cause premature failure. Thus it is desirable to form the bend feature in the cable prior to mounting the sensitive electrical components, so that these electrical components are not subsequently stressed during the bending step. As explained above, such a procedure requires the bent cable to withstand the high temperature soldering process.

Figure 3:
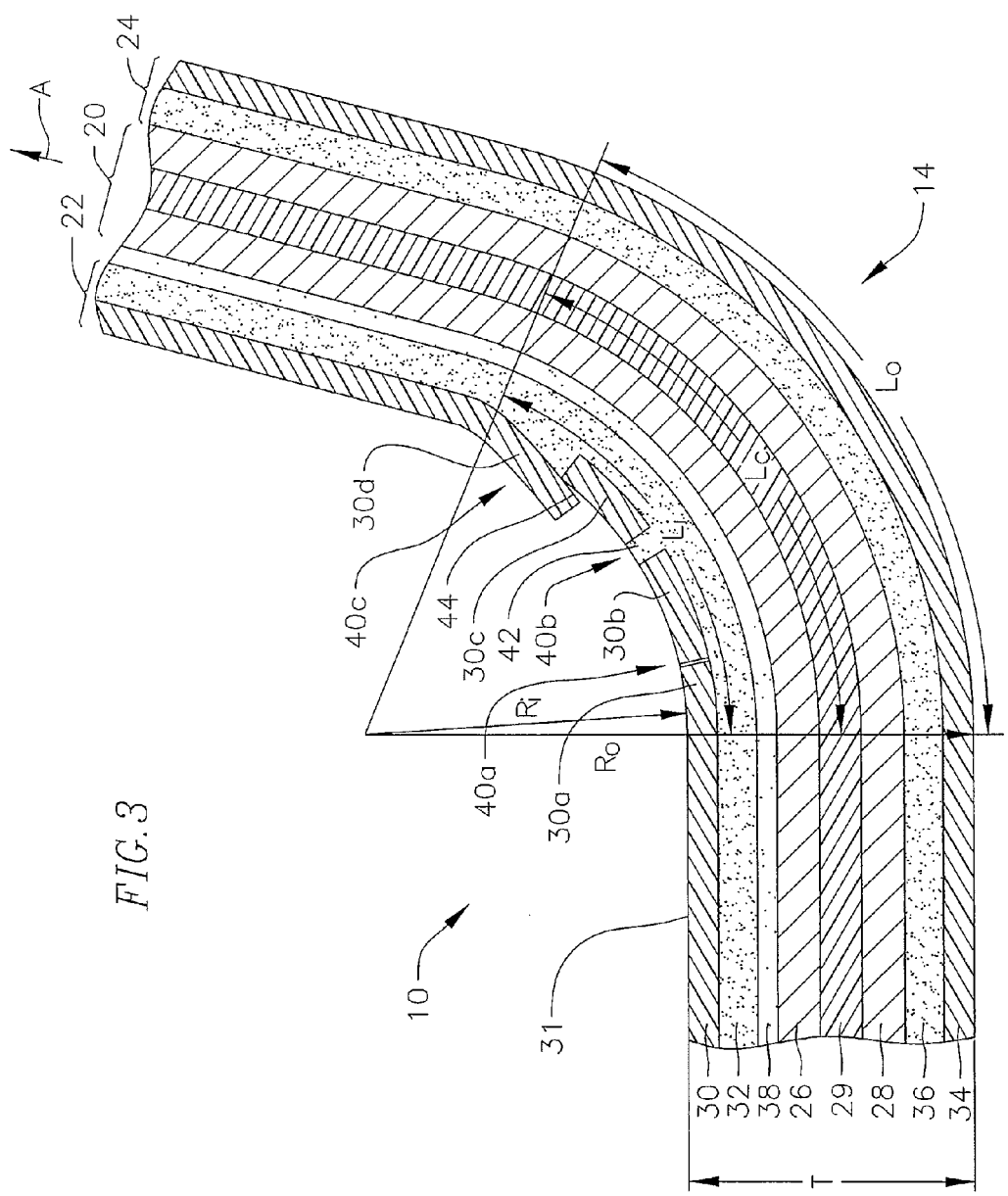
FIG. 3 is partial cross-sectional view of a flex cable according to an embodiment of the invention.

To develop an improved temperature tolerant cable, several cables were studied, and delamination such as that shown in FIG. 2 was observed in various flex cables with different types of bend features and bend-forming processes. Accordingly the structure of the cable itself was further studied. A cable 10 with a temperature-tolerant cover layer construction according to an embodiment of the invention is shown in FIG. 3. In this embodiment, the cable 10 includes a core layer 20, an inner layer 22, and an outer layer 24. The core layer 20 includes one or more active elements such as conductors. In the embodiment shown, the core layer 20 includes two conductors 26, 28 separated by a core 29. The core 29 is a spacer material that separates the two conductors 26, 28 and isolates them from each other. In other embodiments the cable 10 can include more or fewer conductors, such as one conductor as shown in FIG. 2, or additional conductors separated by additional core layers 29. The conductors 26, 28 may be electrical conductors or other types of active elements that transmit electrical signals, digital, direct or alternating current, fiber optic signals, radio frequency, or other types of signals. In one embodiment the conductors 26, 28 are metal conductors such as copper wires. The metal conductors may be plated with different materials, such as gold, nickel, or palladium. When two or more conductors are included, they may be the same material or different materials. In one embodiment the core 29 is a polymer material such as polyimide. An example of a polyimide material is Kapton®, manufactured by Dupont (E. I. du Pont de Nemours and Company).

The core layer 20 is protected on opposite sides by the inner layer 22 and the outer layer 24. Each of these two protective layers 22, 24 includes a cover layer 30, 34 and an adhesive or filler layer 32, 36. The two cover layers 30, 34 provide abrasion and scratch resistance to protect the active elements inside the cable 10 from being scratched, cut, or punctured.

The cover layers 30, 34 may be made from a polymer material such as polyimide (for example, Kapton®).

The two filler layers 32, 36 provide insulation for the active elements inside the cable 10, spacing them apart from the other components of the cable and providing protection against chemicals, corrosion, and other environmental exposure. The filler layers 32, 36 are also used to adhere the cover layers 30, 34 to the core layer 20, holding the cable 10 together. The filler layer may be made from an acrylic adhesive material. The filler layer is typically a softer material than the scratch-resistant polyimide cover layers 30, 34.

In one embodiment, the cable 10 is assembled by laminating the layers 20, 22, 24 together. The layers 20, 22, 24 are initially provided as separate sheets. The inner layer 22 is provided as a sheet with the cover layer material 30 already adhered to the filler layer material 32. A second sheet of the same material is used for the outer layer 24. The core layer 20 is also provided as a pre-assembled sheet with the desired number and type of conductors and spacers attached together. For example, the sheet 20 may include copper layers 26, 28 adhesive-lessly attached to the core layer 29 through a thermal fusion process.

These sheets 20, 22, 24 are then placed in order and laminated together by heating and pressing them in a laminating fixture. The heat and pressure causes the filler material in layers 32 and 36 to melt and flow, thereby adhering each cover layer 30, 34 to the respective conductor 26, 28. In one embodiment, an optional additional filler layer 38 is provided between the conductor 26 and the filler layer 32, as described in further detail below. The laminated cable 10 is then cooled, and the filler layers 32, 36 reset, holding the outer layers 30, 34 to the core layer 20 and thus holding the cable together. The laminated cable 10 can have a thickness T ranging from 0.01 inches to 0.5 inches.

In the final assembly, the cable 10 includes a curved section 14 in which the cable 10 curves along an inner radius Ri at the cover layer 30 and an outer radius Ro at the cover layer 34. The cover layer 30 and filler layer 32 may be together referred to as the "inner layer" 22 as these layers are inside the core layer 20 along the curved section 14, following the inner radius Ri. The cover layer 34 and filler layer 36 may together be referred to as the "outer layer" 24, as they are outside of the core layer 20 along the curved section 14, following the outer radius Ro. The terms "inner" and "outer" are relative terms used to identify the layers on the opposite sides of the core layer 20 along the curved section 14. The term "inner" does not mean that the inner layer is always on the inside, but instead means that with reference to this particular bend feature, the inner layer is on the smaller, inside radius of the curve as compared to the "outer" layer on the opposite side of the core layer.

The inner cover layer 30 follows the inner radius Ri along the curved section 14, and the outer cover layer 34 follows the outer radius Ro along the curved section 14. As mentioned above, due to the thickness T of the cable 10, Ri is less than Ro, and the length Li of the curve 14 along the inner radius Ri is shorter than the length Lo of the curve 14 along the outer radius Ro. The shorter length Li along the cover layer 30 creates the potential for compressive stresses within the cover layer 30 along the curved section 14.

According to an embodiment of the invention, one or more slits 40a-x are formed in the inner cover layer 30 to relieve such compressive stress. In FIG. 3, the cover layer 30 includes three slits 40a, 40b, 40c. The slits 40a-x reduce the amount of material in the cover layer 30 in order to compensate for the shorter length of the curve 14 along the inner radius Ri. By removing a small amount of material at the slits, the remaining cover layer material 30 can occupy the slits as necessary to relieve compressive stress when the cover layer 30 is bent. The number, size, and spacing of the slits are designed according to the particular situation, depending on the radius of curvature, the type of material, the expected temperature conditions, and the available manufacturing techniques. In one embodiment, each slit is sized between 0.001 and 0.003 inches in width, and the slits are spaced apart evenly along the curve 14. The number of slits is determined by the radius of curvature and the amount of material to be removed from the inner layer 30, as described in more detail below.

In one embodiment, the slits 40a-x are formed by laser-cutting the inner layer 22 before the cable 10 is laminated together. FIG. 4 shows an example of an inner layer 22' with five slits 40a-e prior to being laminated to a core layer and opposite cover layer to form a cable 10. The inner layer 22' is passed through a laser cutting process in which one or more lasers cut the slits 40a-e through the inner layer 22', passing completely through both the cover layer 30 and the filler layer 32. In one embodiment, the laser burns away the material at the slits 40a-x, removing the material from both layers 30, 32 along the length and width of the slits 40a-x. In other embodiments, some of the material from layer 32 may remain, but at least the cover material 30 is removed along the slits 40a-x.

This inner layer 22' with the slits 40a-x is then laminated to the core layer 20 and opposite outer layer 24 to form the cable 10, as described above. During the lamination process, the layers are heated and pressed together, causing the filler layer 32 to flow into the slits 40a-x, filling the openings 42 created by the slits (see the opening 42 in FIG. 3). In one embodiment, the lamination process includes tooling that prevents the filler material 32 from flowing up out of the slits, but that allows this material 32 to flow into and fill the slits. Thus, after lamination, the top surface 31 of the inner cover layer 30 is level across the slits, with the filler material 32 filling the openings 42 created by the slits 40. Due to the flexibility of this filler material and its ability to flow during lamination, the slits 40a-x can be formed in the cover layer 30 without leaving depressions or voids in the inner layer 22 of the laminated cable 10.

These slits 40a-x create flexible bending points for the inner layer 22 so that it can be bent into the curve 14, as shown in FIG. 3. The filler material 32 is more flexible and pliant than the cover layer 30, so it can bend and move more easily to accommodate the curve 14. When the cable 10 is bent, the filler material 32 moves out of the way and allows the strips of cover layer material between adjacent slits to move together across the slit instead of compressing.

The slits may take various geometries after being bent into the curve 14. Three example slits 40a, 40b, 40c are shown in FIG. 3. The first slit 40a has been closed by the curve 14, as the two portions of the cover layer 30a, 30b on opposite sides of the slit 40a moved together across the slit 40a to accommodate the curve 14. The second slit 40b includes an opening 42 between the two portions 30b and 30c of the inner cover layer 30. The opening 42 is filled by the inner filler layer 32, as described above. As another example, the third slit 40c includes an overlap 44 in which an end of the cover layer portion 30d extends over the cover layer portion 30c. These three slits 40a, 40b, 40c show examples of the way the cover layer 30 and filler layer 32 can move across the slits to accommodate the curve 14. In these various slit geometries 40a, 40b, 40c, the slit provides relief for the compressive stress that could otherwise build in the cover layer 30 when it is curved along the inner radius Ri.

In one embodiment, a cable includes a plurality of slits that are dimensioned according to slit 40a, without openings 42

(as in slit 40b) or overlaps 44 (as in slit 40c). In such a case, the cover layer portions 30a, 30b come together to completely protect the inner filler layer 32. The portions 30a, 30b come together until they are in contact with each other but are not pushing against each other, so that they are not creating compressive stress. In other embodiments a small amount of compressive stress may be introduced when the two portions 30a, 30b contact each other, but the amount of stress is reduced by the slit and prevents delamination such as that shown in FIG. 2. In another embodiment, a cable includes a combination of slits 40a, 40b, and/or 40c including some with overlap portions 44, openings 42, and/or contacting portions 30a, 30b. The exact geometry of the particular slit may depend on the manufacturing tolerances of the laser cutting process as well as the process for forming the bend feature 14.

In one embodiment, the slits extend across the cable 10 in a direction that is substantially perpendicular to an axial direction A of the core layer 20. In FIG. 3, the core layer 20 has an axial direction A, which is along the axis of the conductor elements 26, 28. In the view of FIG. 3, the slits 40a, 40b, 40c extend into the plane of the page, across the conductor elements in the cable 10. The slits extend approximately perpendicular to both the axial direction A and the radial direction Ri/Ro.

A perspective view showing the orientation of the slits is shown in FIG. 5. In this embodiment, a flex cable 10' according to an embodiment of the invention includes five slits 40a-e. The slits extend substantially parallel to each other in a transverse direction T, extending across the width W of the cable 10' transverse to the axial direction A. The axial direction A is the direction along the axis of the conductor elements 26a, 26b, 26c that extend along the length L of the cable. Multiple isolated conductor elements 26a-y can be provided across the width W of the cable 10'. The slits 40a-x pass across the conductor elements 26a-y extending from one side edge 10a of the cable to the opposite side edge 10b. The cross-sectional view of FIG. 3 is taken along line 3-3 of FIG. 5 (although only three slits 40a, 40b, 40c are shown in the embodiment of FIG. 3).

Referring to FIG. 5, the five slits 40a-e are spaced evenly along the length of the curve 14. That is, the distance d is approximately the same between each slit and between the slits 40a, 40e and the respective ends of the curve 14a, 14b.

The number, size, and spacing of the slits 40 is determined by the geometry of the curve and the thickness of the particular cable. First, the amount of material to be removed from the inner cover layer 30 is determined. Referring back to FIG. 3, the inner cover layer 30 is subjected to compressive stress to compress into the shorter length Li, and the outer cover layer 34 is subjected to tensile stress to stretch across the longer length Lo. At some point between these two layers 30, 34, one of the layers of the cable is subject to the minimum amount of stress, where the tensile and compressive stresses balance each other. This layer follows the neutral axis of the bend. Layers inside of the neutral axis experience compressive stress, and layers outside of the neutral axis experience tensile stress. The length of the curve along the neutral axis is calculated, and then compared to the length Li in order to calculate the number and size of the slits 40.

In the particular example shown in FIG. 3, because the cable 10 is substantially symmetric, the neutral axis and minimum-stress layer is approximately at the core layer 29. Accordingly, to determine the amount of material to be removed by the slits, the length Lc of the curve 14 along the core layer 29 is calculated, and the length Li is subtracted from the length Lc. This difference D in length identifies the linear amount of material that should be removed from the inner cover layer 30.

Once this amount D is known, then either the size or the number of slits is selected. In one embodiment, the size w of each slit (see FIG. 4) is selected based on the length Li of the curve and/or the capability of the cutting equipment. For example, when laser cutting equipment is used, the laser itself may define a minimum width w for the slits. In one embodiment, the size w of the slits is chosen to be the same as the beam width, so that each slit can be formed with only one pass of the laser across the width W of the sheet 22, rather than multiple passes of the beam to create each slit. In another embodiment, the beam width is chosen based on the speed and operating characteristics of the laser, to provide an efficient and high-speed cutting process. For example, a very wide beam width may move at a slow speed, while a smaller width beam can be moved across the sheet more quickly. In one embodiment, the beam width, and the width w of the slits, is approximately 0.001 inches, and in another embodiment less than 0.001 inches. Based on available laser technology, very fine beams may be used to create slits with widths even as small as 0.0001 inches. The width of the slits can be chosen based on the available beam technology.

As another example, the geometry of the curve 14 itself may also affect the choice of slit size w. A very wide curve with a relatively large radius may benefit from smaller slits, with a small width w, as the material is not bent very far to form the curve. The size of the slits can be chosen based on these variables. In one embodiment, the slits are between 0.001 and 0.003 inches in size w, and in one embodiment the slits are approximately 0.002 inches in size w. In another embodiment, the width w is approximately the same as the thickness of the cover layer 30, 34.

When the size of each slit is selected, the difference D is divided by the size of each slit w to determine the number x of slits. At this point the length of the curve and the size and number of slits are known. The final geometry of the slits is arranged by evenly spacing the slits along the length Li of the curve 14. That is, the total amount of material to be removed D is subtracted from the length Li, and then the remaining length is divided by x+1 (the number of slits plus one) to determine the space d between each slit. The laser or other cutting equipment is then programmed to cut the slits of width w at intervals d along the length Li of the curve portion 14.

Alternatively, the number of slits may be selected first, before the size of each slit is determined. For example, along a very tight curve, there may be room for only a small number of slits. The number x of slits can be pre-selected, and then the difference D is divided by the number x of slits to determine the side w of each slit (see FIGS. 4 and 5). As before, the difference D is then subtracted from the length Li, and the remaining length is divided by x+1 to determine the space d between each slit. Alternatively, the space d between slits may be selected first and then the size and number of slits can be calculated.

In one embodiment, the number x of slits, size w of slits, and distance d between slits are all considered together to provide an optimal geometry. For example the distance d between slits is considered when choosing the number x of slits, because a large number of slits will require a small distance d between slits. If the distance d is very small then the slits create very thin ribbons of the cover layer material 30b, 30c between the slits, and these thin ribbons of material can float over the filler material 32 and move out of place. If the distance d is too small, these ribbons of the cover layer do not provide adequate protection for the cable 10. Thus a minimum size for the distance d is considered, such as 2-3 times the thickness of the cover layer 30, 34. In one embodiment, the distance d between the slits is approximately 2-3 times the width w of the slits. The number, size, and spacing of the slits are chosen together to approximate a smooth curve along the inside cover layer 30.

When the number x of slits, size w of slits, and distance d between slits is determined, laser or other cutting equipment is programmed to create this geometry in the inner layer 22. The sheet 22 is passed through the cutting process as described above, to create the slits (see for example FIG. 4). The sheet 22 is then laminated to the core layer 20 and the outer layer 24 as described earlier.

Various slit geometries were tested to determine an optimal size, number, and spacing of the slits 40$a$-$x$. In one embodiment, five slits of 0.002 inches each are equally spaced along the curve 14. In other embodiments, the number of slits can vary from 3 to 7 slits, and the size of each slit can vary from 0.001 inches each to 0.003 inches.

In one embodiment, the slits are created in the flat cable over a distance that is greater than the length Li along the inside of the curve. The extra slits beyond the length of the curve provide tolerance for the formation of the bend feature, so that the bend feature can be mis-aligned and still be located within the range of the slits. Additionally, the provision of extra slits can enable the same flat cable to be used for various different bend features, which simplifies manufacturing. The same process can be used to create flat cables all having the same slit arrangement, and then these cables can be used to form different bend features.

In one embodiment, the cable 10 includes an additional base filler layer 38 between the inner layer 22 and the core layer 20 (see FIG. 3). This layer 38 is provided between the filler layer 32 and the conductor 26. This layer is added on the inside of the core layer 20, between the core 20 and the slits 40$a$-$x$, to provide additional protection for the core layer 20. In case any of the slits 40$a$-$x$ do not completely fill with the filler layer 32 during lamination, or in case one of the slits leaves an opening 42 that is larger than desired, the base filler layer 38 provides an extra layer of insulation between the core 20 and the outside environment so that the slits do not expose the cable to environmental degradation. The extra layer 38 completely covers the conductor 26. This layer 38 also provides additional acrylic material that can move and flow into the slits 40$a$-$x$ during lamination.

Another additional base filler layer such as the layer 38 may be provided between the outer layer 24 and the core layer 20 as well. For example, the same cable 10 can include multiple bend features, such that the layer that is the "inner" layer for one bend feature is the outer layer for a different bend feature. For such a cable, two layers 38 can be provided on either side of the core. Of course, the slits can then be formed in both cover layers 30, 34. The layer that is the "inner" layer for one bend feature can be the "outer" layer for another bend feature.

As shown in FIG. 4, in one embodiment the slits 40$a$-$x$ extend completely across the width W of the layer 22' (and the resulting cable), passing all the way through both opposite sides 22$a$, 22$b$ of the layer 22. In one embodiment the layer 22' includes strips 46$a$, 46$b$ at each side of the layer 22 which are removed by cutting along the cut lines 48$a$, 48$b$. The strips 46$a$, 46$b$ are removed and discarded. This step ensures that the slits 40$a$-$x$ extend completely across the width of the layer 22', so that the slits extend across both edges 10$a$, 10$b$ of the resulting cable. As a result the slits extend to the edges of the finished cable and do not allow the cover material to come under compression at the edges.

In another embodiment, the slits may be spaced unevenly along the curved section of the cable. Such uneven spacing may be appropriate where the radius of curvature changes along the curve 14. If the radius increases along the length of the curve (such that the curve becomes wider and less steep), the slits may become more widely spaced along the length of the curve. If the radius decreases along the length of the curve (such that the curve becomes steeper), the slits may become more closely spaced along the length of the curve. In other embodiments there may be additional features in the electrical component that make uneven spacing of the slits desirable. For example a wider space between two slits may be provided where a curve 14 passes near another component, so that the cover layer 30 provides abrasion resistance along the curve near that component. The slits may also be spaced to avoid other features along the cable 10, such as openings or branches for the connection of other components.

The slits described above reduce the compressive stress in the inner layer 22 and thereby increase the ability of the inner layer to withstand high temperature conditions. Although the slits create openings in the cover layer 30, removing the protective covering material and exposing the softer inner filler layer 32, the number, size, and spacing of the slits is designed for a particular bend feature, so that the resulting cable 10 with the slits provides sufficient protection for the active components within the cable while reducing the compressive stress in the inside cover layer 30. Because the strips of cover layer material between the slits can move together across the openings 42 created by the slits 40, the compressive stress in this layer is reduced. As a result, the cable 10 can be subjected to higher temperatures without the cover layer 30 delaminating from the filler layer 32 and creating buckles and voids.

In one embodiment, a flex cable including slits across a bend feature can survive prolonged exposure (more than a few seconds) at temperatures above 125° C., and in another embodiment above 220° C., and in another embodiment above 300° C., and in another embodiment at temperatures up to 350° C. The flex cable can be used in applications such as aerospace, space, marine, and automotive applications, power plants, sensor products, steam turbines, missiles, radar systems, and applications were components operate at temperatures above 125° C.

The flex cable can also be bent prior to high temperature manufacturing steps, such as a component soldering process, which can elevate the flex cable temperature above 125° C. and typically above 220° C. The process for forming the bend feature(s) in the cable prior to high temperature assembly operations can be accomplished with cheaper equipment, without having to work around sensitive or fragile electrical components and soldered joints. As described above, high-temperature manufacturing steps in the prior art were performed with the flex cable in the flat condition, prior to forming bend features in the cable.

In another embodiment, a cable including slits across a bend feature can be curved into a tighter bend than prior art cables without such slits. In one embodiment, the cable is curved into a radius Ri that is approximately 10-15 times the thickness T of the cable. In one embodiment the radius Ri is 10-20% smaller than in prior applications. The flex cables with tighter bends allow for more complex 3-dimensional shapes to be used in the design and layout of the electrical components in the final assembly.

Additionally, the use of lasers to form the slits enables slits to be made quickly and accurately. Lamination of the cable layers together after the slits are formed completes the slit features without requiring additional surface treatment or other steps to prepare the cover layer and slits for bending and use.

Figure 6:
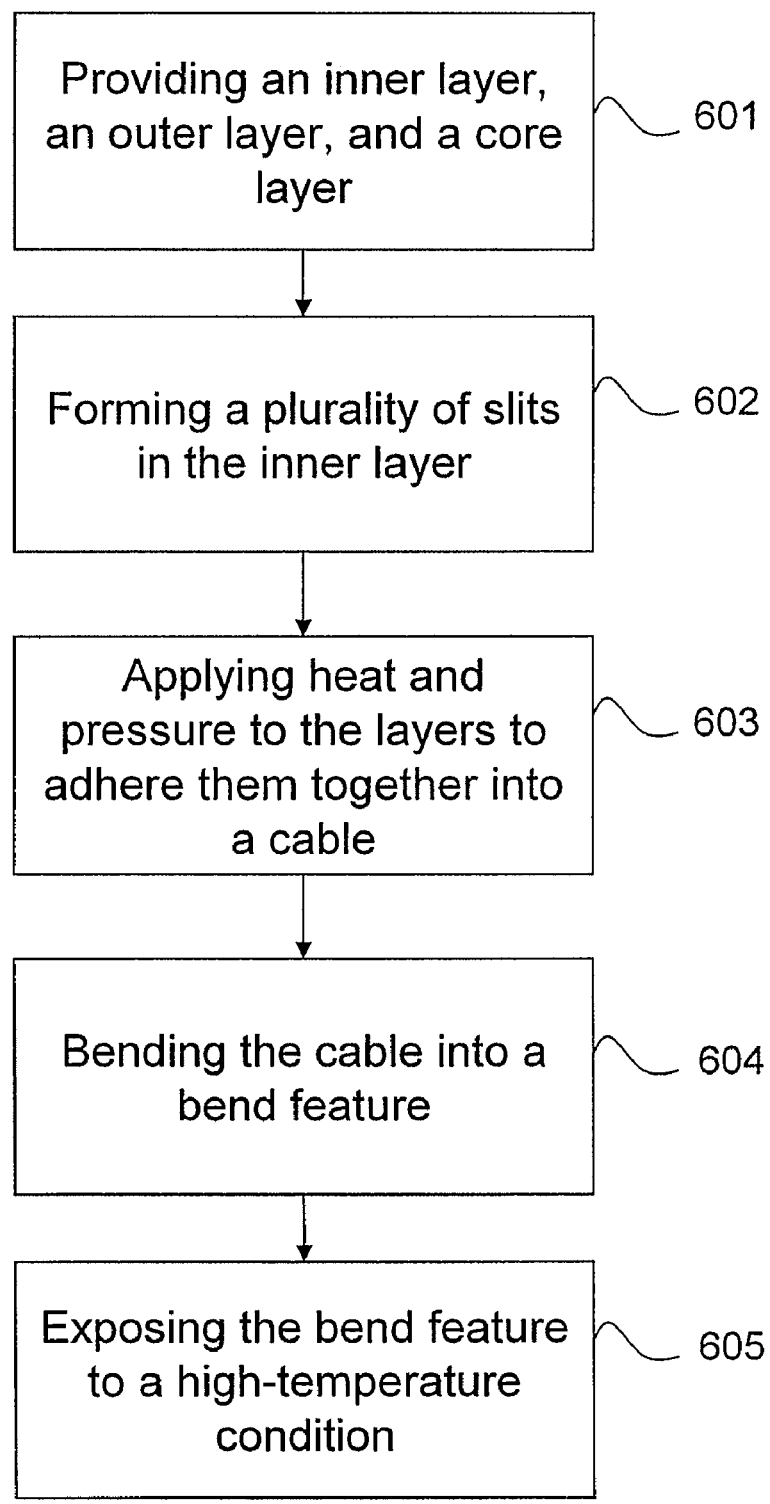
FIG. 6 is a flowchart showing a method of constructing a flex cable according to an embodiment of the invention.

A method for constructing a temperature-tolerant flex cable according to an embodiment of the invention is shown in FIG. 6. The method includes providing an inner layer, an outer layer and a core layer 601, and forming a plurality of slits in the inner layer 602. In one embodiment forming a plurality of slits in the inner layer includes passing a laser beam across the inner layer, as described above, and in one embodiment this includes removing both the cover layer and the filler layer at the slits. The method also includes applying heat and pressure to the layers to adhere them together into a cable 603. In one embodiment, this includes moving the filler layer into the slits. In one embodiment, an additional base filler layer is provided between the inner layer and the core layer before the layers are heated and pressed together. The method also includes bending the cable into a bend feature 604, with the inner layer on the inside radius of the curve, and exposing the bend feature to a high-temperature condition 605. The high-temperature condition may be a high-temperature soldering step. For example, the method may include mounting the cable to an electrical component, and then soldering a joint on the electrical component at high temperature.

In another embodiment, a flex cable can include slits that are curved or non-parallel. That is, the slits are not necessarily straight, parallel lines. Curved or non-parallel slits may be useful when the cable is curved into a three-dimensional bend feature, such as a sphere. An example of an arrangement of non-parallel slits for a flex cable according to an embodiment of the invention is shown in FIG. 7. The slits 240 extend in a radial pattern, with some slits having a longer length and extending further toward the center of the pattern than other slits. This pattern of slits can be formed in a flex cable as described above, and the flex cable can be formed into a three-dimensional bend feature such as bending the cable in a spherical shape. The amount of material removed from the cable (by forming the slits) increases away from the center of the pattern, which corresponds to the "top" of the sphere. The slits also may get wider as they move away from the center.

In the example shown in FIG. 7, the slits diverge away from the center of the pattern, and they do not intersect. In other embodiments, other patterns of slits can be created, depending on the particular bend feature, including slits that converge, diverge, curve, and/or intersect.

Although the present invention has been described and illustrated in respect to exemplary embodiments, it is to be understood that it is not to be so limited, and changes and modifications may be made therein which are within the full intended scope of this invention as hereinafter claimed. For example, although only one bend feature is shown in the cable in the figures, a single cable can include more than one bend feature, with more than one set of slits. Additionally the cable can have various different layers, including different kinds of conductors or signal elements.

What is claimed is:

1. A flex cable for bending into a curve, comprising:
   a core layer comprising a plurality of conductors, at least one conductor extending in an axial direction;
   an outer layer covering the core layer along an outside radius of the curve;
   an inner layer covering the core layer along an inside radius of the curve; and
   at least one slit formed in the inner layer, the at least one slit extending in a transverse direction that is transverse to the axial direction of the at least one conductor,
   wherein the at least one slit extends across each of the conductors, and
   wherein the inner layer comprises a cover layer and a filler layer, and wherein the at least one slit forms an opening in the cover layer, and wherein the filler layer extends into the opening.

2. The flex cable of claim 1, wherein the at least one slit comprises a plurality of slits.

3. The flex cable of claim 2, wherein the slits are equally spaced along the curve.

4. The flex cable of claim 2, wherein the slits have a width, and wherein the slits are equally spaced apart from each other along the curve by a distance that is 2-3 times the width.

5. The flex cable of claim 2, wherein the slits are each between 0.001 and 0.003 inches in width.

6. The flex cable of claim 2, wherein the cover layer comprises a thickness, and wherein each slit has a width that is approximately equal to the thickness.

7. The flex cable of claim 2, wherein a width of each slit is equal to a length of the curve along the core layer minus a length of the curve along the inner layer, divided by the number of slits.

8. The flex cable of claim 2, wherein the slits are equally spaced apart from each other along the curve by a distance that is 2-3 times a thickness of the cover layer.

9. The flex cable of claim 2, wherein the slits are parallel.

10. The flex cable of claim 2, wherein the slits are non-parallel.

11. The flex cable of claim 10, wherein the slits extend in a radial pattern.

12. The flex cable of claim 1, further comprising a base filler layer between the core layer and the inner layer.

13. The flex cable of claim 1, wherein the cable has a thickness and wherein the curve has a radius that is 10-15 times the thickness.

14. The flex cable of claim 1, wherein the slit extends across first and second opposite side edges of the inner layer.

15. The flex cable of claim 1, wherein the cover layer comprises a first portion and a second portion on opposite sides of the slit, and wherein the first and second portions contact each other.

* * * * *